United States Patent
Chuang et al.

(10) Patent No.: US 8,772,981 B2
(45) Date of Patent: Jul. 8, 2014

(54) MULTIPLEXER AND MULTIPLEXING METHOD FOR USE WITH THE SAME

(75) Inventors: Chen-Jung Chuang, Sanchong (TW); Chien-Kuo Wang, Hsinchu (TW)

(73) Assignee: Ili Technology Corporation, Jhubei (TW)

( * ) Notice: Subject to any disclaimer, the term of this patent is extended or adjusted under 35 U.S.C. 154(b) by 879 days.

(21) Appl. No.: 12/965,408

(22) Filed: Dec. 10, 2010

(65) Prior Publication Data

US 2011/0187202 A1    Aug. 4, 2011

(30) Foreign Application Priority Data

Jan. 29, 2010   (TW) ................................ 99102614 A

(51) Int. Cl.
 *H02B 1/24*  (2006.01)
 *H01H 47/00*  (2006.01)
 *H02J 1/00*  (2006.01)
 *H02B 1/00*  (2006.01)

(52) U.S. Cl.
 CPC ....................................... *H02B 1/00* (2013.01)
 USPC ................. 307/115; 307/75; 307/85

(58) Field of Classification Search
 USPC ............................................... 307/115, 75, 85
 See application file for complete search history.

(56) References Cited

U.S. PATENT DOCUMENTS 6,853,098 B1 * 2/2005 Jackson et al. .................. 307/85
7,414,330 B2 * 8/2008 Chen ............................... 307/43

* cited by examiner

*Primary Examiner* — Rexford Barnie
*Assistant Examiner* — Dru Parries

(57) ABSTRACT

A multiplexer includes: a first switch unit coupled between a first input terminal and an output terminal and including a series connection of first and second switches; a second switch unit coupled between a second input terminal and the output terminal; and a third switch unit coupled to a third input terminal and a common node between the first and second switches. Different first and second voltages, and a third voltage greater than one of the first and second voltages and less than the other one of the first and second voltage are applied respectively to the first, second and third input terminals. The multiplexer is operable between a first mode, where the first voltage is transmitted to the output terminal, and a second mode, where the second voltage is transmitted to the output terminal and the third voltage is transmitted to the common node between the first and second switches.

6 Claims, 3 Drawing Sheets

MULTIPLEXER AND MULTIPLEXING METHOD FOR USE WITH THE SAME

CROSS-REFERENCE TO RELATED APPLICATION

This application claims priority of Taiwanese Application No. 099102614, filed on Jan. 29, 2010.

BACKGROUND OF THE INVENTION

1. Field of the Invention

This invention relates to a multiplexer and multiplexing method for use with the same.

2. Description of the Related Art

In a liquid crystal display employing dot inversion techniques, a multiplexer is applied to transmit alternately positive and negative voltages to each pixel electrode of the liquid crystal display to achieve voltage inversion.

Referring to FIG. 1, a conventional multiplexer includes a first input terminal ($IN_1$) adapted for receiving a first voltage ($V_1$), a second input terminal ($IN_2$) adapted for receiving a second voltage ($V_2$) less than the first voltage ($V_1$), an output terminal (OUT), a first switch 11 coupled between the first input terminal ($IN_1$) and the output terminal (OUT), and a second switch 12 coupled between the second input terminal ($IN_2$) and the output terminal (OUT). Each of the first and second switches 11, 12 is operable between an ON-state and an OFF-state.

The conventional multiplexer is operable between a first mode and a second mode. When the conventional multiplexer is in the first mode, the first and second switches are in the ON-state and the OFF-state, respectively, such that the first voltage ($V_1$) is transmitted to the output terminal (OUT) through the first switch 11. In this case, the voltage across the second switch 12 is substantially equal to a difference between the first and second voltages ($V_1$, $V_2$), i.e., $V_1-V_2$. When the multiplexer is in the second mode, the first and second switches are in the OFF-state and the ON-state, respectively, such that the second voltage ($V_2$) is transmitted to the output terminal (OUT) through the second switch 12. In this case, a voltage across the first switch 11 is substantially equal to the difference between the first and second voltages ($V_1$, $V_2$), i.e., $V_1-V_2$.

When the difference between the first and second voltages ($V_1$, $V_2$), i.e., $V_1-V_2$, is larger, the first and second switches 11, 12 are required to have a higher endure voltage so as to prevent damage thereto. Alternatively, the first and second switches 11, 12 are required to be fabricated through a high voltage semiconductor process, thereby resulting in relatively high costs.

SUMMARY OF THE INVENTION

Therefore, the object of the present invention is to provide a multiplexer and multiplexing method for use with the same that permit use of electrical devices with a relatively low endure voltage therein.

According to one aspect of this invention, a multiplexer comprises:

a first input terminal adapted for receiving a first voltage;

a second input terminal adapted for receiving a second voltage different from the first voltage;

a third input terminal adapted for receiving a third voltage greater than one of the first and second voltages and less than the other of the first and second voltages;

an output terminal;

a first switch unit coupled between the first input terminal and the output terminal and including a series connection of first and second switches, each of the first and second switches being operable between an ON-state and an OFF-state;

a second switch unit coupled between the second input terminal and the output terminal, and operable between an ON-state and an OFF-state; and a third switch unit coupled to the third input terminal and a common node between the first and second switches, the third switch unit being operable to establish electrical connection between the third input terminal and the common node between the first and second switches.

The multiplexer is operable between a first mode, where the first and second switches are in the ON-state and where the second switch unit is in the OFF-state such that the first voltage is transmitted to the output terminal through the first and second switches, and a second mode, where the first and second switches are in the OFF-state, where the second switch unit is in the ON-state, and where the third switch unit establishes electrical connection between the third input terminal and the common node between the first and second switches such that the second voltage is transmitted to the output terminal through the second switch unit and that the third voltage is transmitted to the common node between the first and second switches through the third switch unit.

According to another aspect of this invention, there is provided a multiplexing method for use with a multiplexer that includes first, second, and third input terminals, an output terminal, a first switch unit coupled between the first input terminal and the output terminal and including first and second switches connected in series with each other, a second switch unit coupled between the second input terminal and the output terminal, and a third switch unit coupled to the third input terminal and a common node between the first and second switches. The multiplexing method comprises the steps of:

(a) supplying a first voltage to the first input terminal of the multiplexer;

(b) supplying a second voltage different from the first voltage to the second input terminal of the multiplexer;

(c) supplying a third voltage greater than one of the first and second voltages and less than the other one of the first and second voltages to the third input terminal of the multiplexer; and (d) configuring the first and second switches to operate in an OFF-state, configuring the second switch unit to operate in an ON-state, and configuring the third switch unit to establish electrical connection between the third terminal and the common node between the first and second switches such that the second voltage is transmitted to the output terminal of the multiplexer and that the third voltage is transmitted to the common node between the first and second switches.

BRIEF DESCRIPTION OF THE DRAWING

Other features and advantages of the present invention will become apparent in the following detailed description of the preferred embodiment of this invention, with reference to the accompanying drawings, in which.

DETAILED DESCRIPTION OF THE PREFERRED EMBODIMENT

Figure 2:
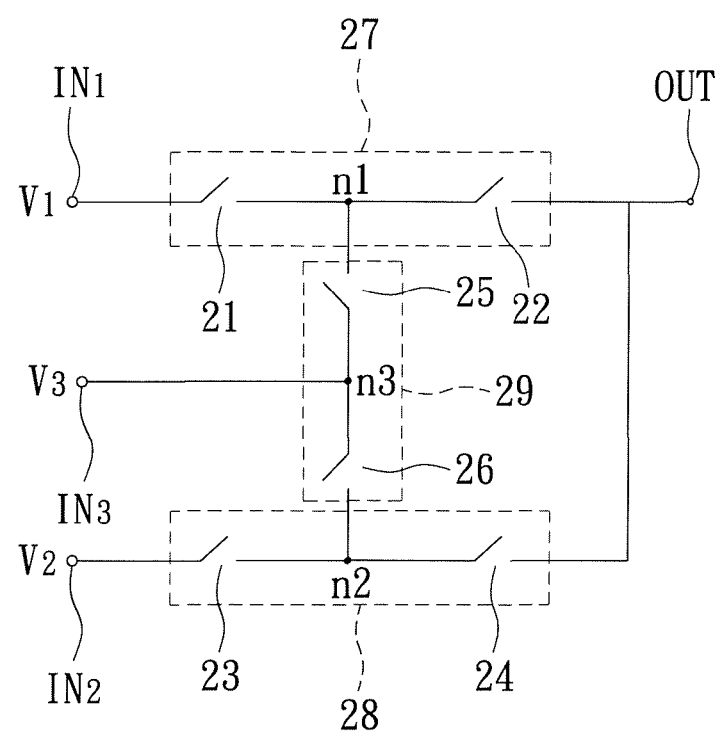
FIG. 2 is a schematic electrical circuit diagram of the preferred embodiment of a multiplexer according to this invention.

Referring to FIG. 2, the preferred embodiment of a multiplexer according to this invention includes a first input terminal ($IN_1$), a second input terminal ($IN_2$), a third input terminal ($IN_3$), an output terminal (OUT), a first switch unit 27, a second switch unit 28 and a third switch unit 29.

The first input terminal ($IN_1$) is adapted for receiving a first voltage ($V_1$). The second input terminal ($IN_2$) is adapted for receiving a second voltage ($V_2$) different from the first voltage ($V_1$). The third input terminal ($IN_3$) is adapted for receiving a third voltage ($V_3$) greater than one of the first and second voltages ($V_1$, $V_2$) and less than the other one of the first and second voltages ($V_1$, $V_2$). In this embodiment, the second voltage ($V_2$) is less than the first voltage ($V_1$), and the third voltage ($V_3$) is less than the first voltage ($V_1$) and greater than the second voltage ($V_2$), i.e., $V_1 > V_3 > V_2$.

The first switch unit 27 is coupled between the first input terminal ($IN_1$) and the output terminal (OUT), and includes a series connection of first and second switches 21, 22. Each of the first and second switches 21, 22 is operable between an ON-state and an OFF-state. In this embodiment, the first switch 21 is coupled to the first input terminal ($IN_1$), and the second switch 22 is coupled to the output terminal (OUT).

The second switch unit 28 is coupled between the second input terminal ($IN_2$) and the output terminal (OUT), and is operable between an ON-state and an OFF-state. In this embodiment, the second switch unit 28 includes a series connection of third and fourth switches 23, 24, wherein the third switch 23 is coupled to the second input terminal ($IN_2$) and the fourth switch 24 is coupled to the output terminal (OUT). Each of the third and fourth switches 23, 24 conducts when the second switch unit 28 is in the ON-state, and non-conducts (e.g., does not conduct) when the second switch unit 28 is in the OFF-state.

The third switch unit 29 is coupled among the third input terminal ($IN_3$), a common node (n1) between the first and second switches 21, 22 of the first switch unit 27, and a common node (n2) between the third and fourth switches 23, 24 of the second switch unit 28. The third switch unit 29 is operable to establish electrical connection between the third input terminal ($IN_3$) and the common node (n1) between the first and second switches 21, 22, and electrical connection between the third input terminal ($IN_3$) and the common node (n2) between the third and fourth switches 23, 24. In this embodiment, the third switch unit 29 includes a series connection of fifth and sixth switches 25, 26, wherein the fifth switch 25 is coupled to the common node (n1), the sixth switch 26 is coupled to the common node (n2) between the third and fourth switches 23, 24, and a common node (n3) between the fifth and sixth switches 25, 26 is coupled to the third input terminal ($IN_3$). Each of the fifth and sixth switches 25, 26 is operable between an ON-state and an OFF-state. When the fifth and sixth switches 25, 26 are respectively in the ON-state and the OFF-state, the third switch unit 29 establishes the electrical connection between the third input terminal ($IN_3$) and the common node (n1) between the first and second switches 21, 22 through the fifth switch 25. When the fifth and sixth switches 25, 26 are respectively in the OFF-state and the ON-state, the third switch unit 29 establishes the electrical connection between the third input terminal ($IN_3$) and the common node (n2) between the third and fourth switches 23, 24 through the sixth switch 26.

The multiplexer is operable between a first mode and a second mode. When the multiplexer is in the first mode, the first, second and sixth switches 21, 22, 26 are in the ON-state, and the second switch unit 28 and the fifth switch 25 are in the OFF-state. In this case, the first voltage ($V_1$) is transmitted to the output terminal (OUT) through the first and second switches 21, 22. The third voltage ($V_3$) is transmitted to the common node (n2) between the third and fourth switches 23, 24 through the sixth switch 26 such that, a voltage across the third switch 23 is substantially equal to $V_3-V_2$ and that a voltage across each of the fourth and fifth switches 24, 25 is substantially equal to $V_1-V_3$. As a result, in order to prevent damage to the third, fourth and fifth switches 23, 24, 25, the third switch 23 is required to have an endure voltage greater than $V_3-V_2$, and the fourth and fifth switches 24, 25 are required to have an endure voltage greater than $V_1-V_3$. When the multiplexer is in the second mode, the first, second and sixth switches 21, 22, 26 are in the OFF-state and the second switch unit 28 and the fifth switch 25 are in the ON-state. In this case, the second voltage ($V_2$) is transmitted to the output terminal (OUT) through the third and fourth switches 23, 24. The third voltage ($V_3$) is transmitted to the common node (n1) between the first and second switches 21, 22 through the fifth switch 25 such that a voltage across the first switch 21 is substantially equal to $V_1-V_3$ and that a voltage across each of the second and sixth switches 22, 26 is substantially equal to $V_3-V_2$. Similarly, in order to prevent damage to the first, second and sixth switches 21, 22, 26, the first switch 21 is required to have an endure voltage greater than $V_1-V_3$, and the second and sixth switches 22, 26 are required to have an endure voltage greater than $V_3-V_2$.

Figure 1:
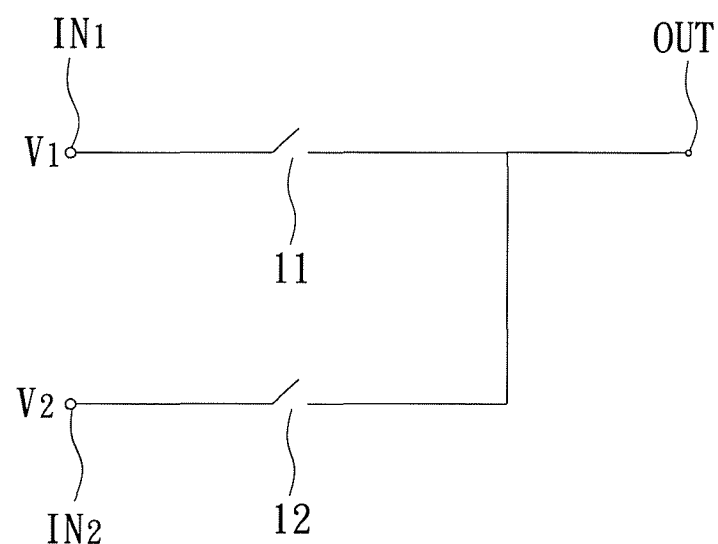
FIG. 1 is a schematic electrical circuit diagram of a conventional multiplexer.

Preferably, the third voltage ($V_3$) is substantially equal to an average of the first and second voltages ($V_1$, $V_2$), i.e., $(V_1+V_2)/2$. Thus, the voltage across each of the first, second, third, fourth, fifth and sixth switches 21, 22, 23, 24, 25, 26 is substantially equal to $(V_1-V_2)/2$ that is smaller than the voltage ($V_1-V_2$) across each of the first and second switches 11, 12 of the aforesaid conventional multiplexer in FIG. 1. In other words, the first, second, third, fourth, fifth and sixth switches 21, 22, 23, 24, 25, 26 are able to have the same endure voltage that is relatively low as compared to that of the first and second switches 11, 12 of the aforesaid conventional multiplexer. The object of the invention is thus met.

Figure 3:
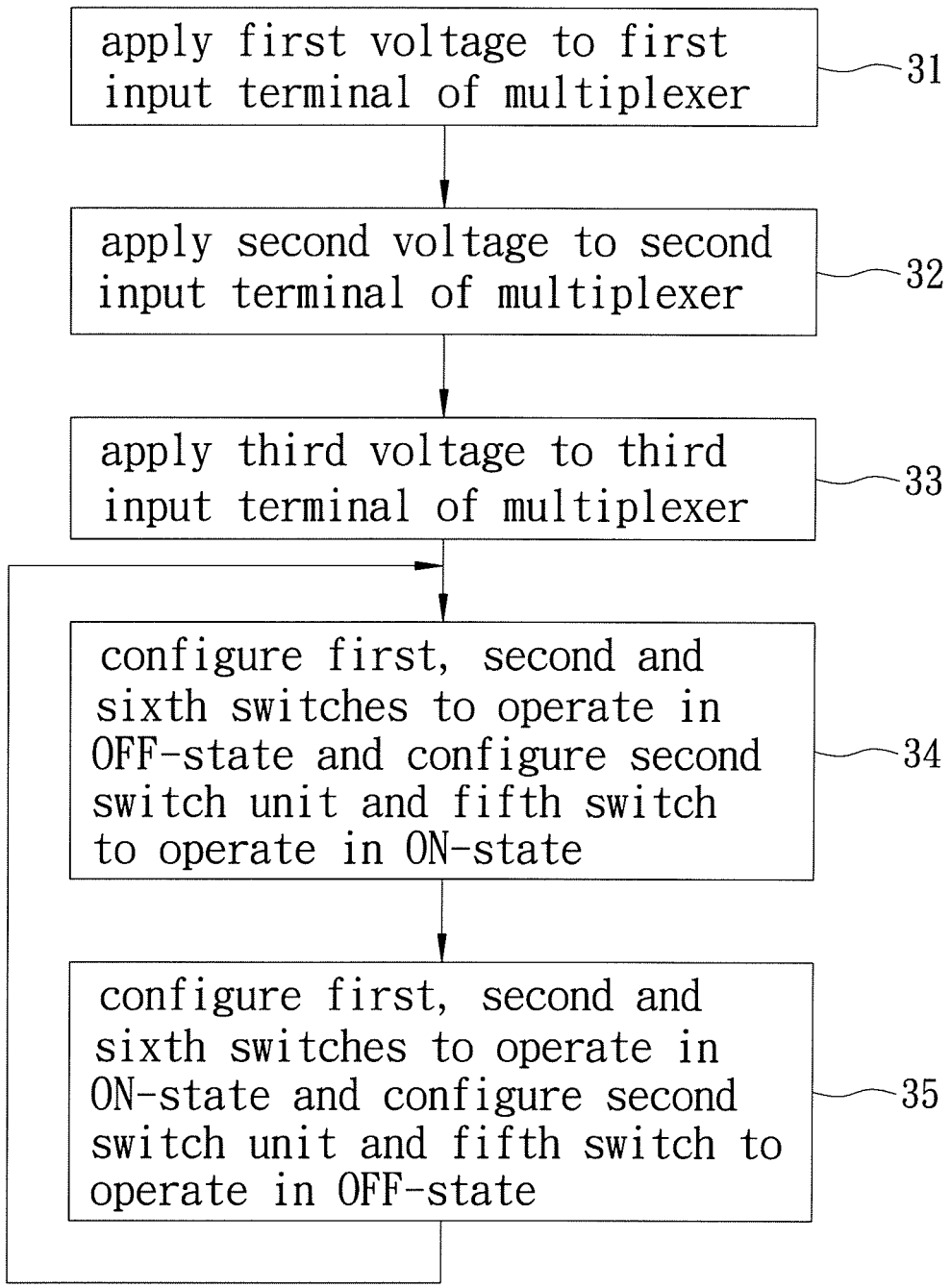
FIG. 3 is a flow chart of a multiplexing method performed by the multiplexer of the preferred embodiment.

Referring to FIG. 3, there is shown a flow chart of a multiplexing method performed by the multiplexer of the preferred embodiment and enabling the multiplexer to generate an output for driving a pixel electrode (not shown) of a liquid crystal display (not shown) employing dot inversion techniques.

In step 31, the first voltage ($V_1$) is supplied to the first input terminal ($IN_1$) of the multiplexer.

In step 32, the second voltage ($V_2$) is supplied to the second input terminal ($IN_2$) of the multiplexer.

In step 33, the third voltage ($V_3$) is supplied to the third input terminal ($IN_3$) of the multiplexer.

In step 34, the first, second and sixth switches 21, 22, 26 are configured to operate in the OFF-state and the second switch unit 28 and the fifth switch 25 are configured to operate in the ON-state such that the second voltage ($V_2$) is transmitted to the output terminal (OUT) of the multiplexer and that the third voltage ($V_3$) is transmitted to the common node (n1) between the first and second switches 21, 22. As a result, the output equal to the second voltage ($V_2$) is outputted at the output terminal (OUT).

In step 35, the first, second and sixth switches 21, 22, 26 are configured to operate in the ON-state and the second switch unit 28 and the fifth switches 25 are configured to operate in the OFF-state such that the first voltage ($V_1$) is transmitted to the output terminal (OUT) of the multiplexer and that the third voltage ($V_3$) is transmitted to the common node (n2) between the third and fourth switches 23, 24. As a result, the output equal to the first voltage ($V_1$) is outputted at the output terminal (OUT). Then, the flow goes back to step 34. Thus, the multiplexer alternately outputs at the output terminal (OUT) the first and second voltages ($V_1, V_2$) that serves as the output applied to the pixel electrode of the liquid crystal display.

While the present invention has been described in connection with what is considered the most practical and preferred embodiment, it is understood that this invention is not limited to the disclosed embodiment but is intended to cover various arrangements included within the spirit and scope of the broadest interpretation and equivalent arrangements.

What is claimed is:

1. A multiplexer comprising:
   a first input terminal adapted for receiving a first voltage;
   a second input terminal adapted for receiving a second voltage different from the first voltage;
   a third input terminal adapted for receiving a third voltage greater than one of the first and second voltages and less than the other of the first and second voltages;
   an output terminal;
   a first switch unit coupled between said first input terminal and said output terminal and including a series connection of first and second switches, each of said first and second switches being operable between an ON-state and an OFF-state;
   a second switch unit coupled between said second input terminal and said output terminal, and operable between an ON-state and an OFF-state; and
   a third switch unit coupled to said third input terminal and a common node between said first and second switches, said third switch unit being operable to establish electrical connection between said third input terminal and said common node between said first and second switches;
   wherein said multiplexer is operable between a first mode, where said first and second switches are in the ON-state and where said second switch unit is in the OFF-state such that the first voltage is transmitted to said output terminal through said first and second switches, and a second mode, where said first and second switches are in the OFF-state, where said second switch unit is in the ON-state, and where said third switch unit establishes electrical connection between said third input terminal and said common node between said first and second switches such that the second voltage is transmitted to said output terminal through said second switch unit and that the third voltage is transmitted to said common node between said first and second switches through said third switch unit.

2. The multiplexer of claim 1, wherein:
   said second switch unit includes a series connection of third and fourth switches, each of said third and fourth switches conducting when said second switch unit is in the ON-state, and non-conducting when said second switch unit is in the OFF-state;
   said third switch unit is further coupled to said second switch unit, and includes a series connection of fifth and sixth switches, said fifth switch being coupled to said common node between said first and second switches, said sixth switch being coupled to a common node between said third and fourth switches, said third input terminal being coupled to a common node between said fifth and sixth switches, each of said fifth and sixth switches being operable between an ON-state and an OFF-state;
   when said multiplexer is in the first mode, said fifth and sixth switches are in the OFF-state and the ON-state, respectively, such that the third voltage is transmitted to said common node between said third and fourth switches through said sixth switch; and
   when said multiplexer is in the second mode, said fifth and sixth switches are in the ON-state and the OFF-state, respectively, such that the third voltage is transmitted to said common node between said first and second switches.

3. A multiplexing method for use with a multiplexer that includes first, second, and third input terminals, an output terminal, a first switch unit coupled between the first input terminal and the output terminal and including a series connection of first and second switches, a second switch unit coupled between the second input terminal and the output terminal, and a third switch unit coupled to the third input terminal and a common node between the first and second switches, said multiplexing method comprising the steps of:
   (a) supplying a first voltage to the first input terminal of the multiplexer;
   (b) supplying a second voltage different from the first voltage to the second input terminal of the multiplexer;
   (c) supplying a third voltage greater than one of the first and second voltages and less than the other one of the first and second voltages to the third input terminal of the multiplexer; and
   (d) configuring the first and second switches to operate in an OFF-state, configuring the second switch unit to operate in an ON-state, and configuring the third switch unit to establish electrical connection between the third input terminal and the common node between the first and second switches such that the second voltage is transmitted to the output terminal of the multiplexer and that the third voltage is transmitted to the common node between the first and second switches.

4. The multiplexing method of claim 3, further comprising the step of:
   (e) configuring the first and second switches to operate in an ON-state and configuring the second switch unit to operate in an OFF-state such that the first voltage is transmitted to the output terminal of the multiplexer.

5. The multiplexing method of claim 4, further comprising the step of:
   (g) repeating alternately steps (d) and (e) such that the multiplexer alternately outputs the first and second voltages at the output terminal.

6. The multiplexing method of claim 3, wherein the third voltage is substantially equal to an average of the first and second voltages.

* * * * *